United States Patent [19]
Okamoto

[11] Patent Number: 5,162,735
[45] Date of Patent: Nov. 10, 1992

[54] OPERATIONAL AMPLIFIER CIRCUIT WITH IMPROVED GAIN OF FEEDBACK LOOP

[75] Inventor: Toshiyuki Okamoto, Tokyo, Japan

[73] Assignee: NEC Corporation, Tokyo, Japan

[21] Appl. No.: 839,905

[22] Filed: Feb. 21, 1992

[30] Foreign Application Priority Data

Feb. 28, 1991 [JP] Japan ................................. 3-59495

[51] Int. Cl.⁵ .............................................. H03F 3/45
[52] U.S. Cl. ..................................... 330/253; 330/277
[58] Field of Search ............... 330/252, 253, 257, 260, 330/277, 292, 294

[56] References Cited

U.S. PATENT DOCUMENTS 4,562,408 12/1985 Nagai et al. ......................... 330/253
5,070,306 12/1991 Okanoto ............................. 330/253

Primary Examiner—Steven Mottola
Attorney, Agent, or Firm—Helfgott & Karas

[57] ABSTRACT

An operational amplifier circuit comprises an input amplification circuit, a driving circuit coupled with the input amplification circuit, and an averaging circuit for providing a feedback loop, and increases the magnitude of an input differential voltage signal so as to produce an output differential voltage signal, wherein an average voltage of output voltage levels of the output differential voltage signal is supplied to the input amplification circuit for increasing the gain of the averaging circuit.

3 Claims, 3 Drawing Sheets

5,162,735

OPERATIONAL AMPLIFIER CIRCUIT WITH IMPROVED GAIN OF FEEDBACK LOOP

FIELD OF THE INVENTION

This invention relates to an operational amplifier circuit and, more particularly, to an operational amplifier circuit implemented by field effect transistors.

DESCRIPTION OF THE RELATED ART

A typical example of the operational amplifier circuit with an input amplification stage and a driving stage is illustrated in FIG. 1 of the drawings, and the input amplification stage and the driving stage are labeled with reference numerals 1 and 2, respectively. The input amplification stage 1 largely comprises a constant current source 1a coupled with a first power voltage line 3a, a pair of p-channel enhancement type field effect transistors 1b and 1c coupled in parallel with the constant current source 1a, and n-channel enhancement type field effect transistors 1d and 1e coupled in parallel between the p-channel enhancement type field effect transistors 1b and 1c and a second constant voltage line 3b. An input differential voltage signal is applied between a pair of input nodes IN1 and IN2, and the pair of input nodes IN1 and IN2 are respectively coupled with the gate electrodes of the p-channel enhancement type field effect transistors 1b and 1c. A constant voltage level Vb is applied to the gate electrodes of the n-channel enhancement type field effect transistors 1d and 1e, and, for this reason, the n-channel enhancement type field effect transistors 1d and 1e serve as load elements providing predetermined resistances substantially equal to each other.

The driving stage 2 comprises a first inverting circuit or a first series combination of a p-channel enhancement type field effect transistor 2a and an n-channel enhancement type field effect transistor 2b, and a second inverting circuit or a second series combination of a p-channel enhancement type field effect transistor 2c and an n-channel enhancement type field effect transistor 2d, and the first and second series combinations are respectively associated with a pair of output nodes OUT1 and OUT2. The n-channel enhancement type field effect transistors 2b and 2d are accompanied with phase compensators 2e and 2f, and each of the phase compensators 2e and 2f is implemented by a capacitor 2g and an n-channel enhancement type field effect transistor 2h coupled between the associated output node OUT1 or OUT2 and the gate electrode of the n-channel enhancement type field effect transistor 2b and 2d. A constant voltage level is supplied to the gate electrodes of the n-channel enhancement type field effect transistors 2h, and allows the n-channel enhancement type field effect transistors 2h to serve as constant current source.

The p-channel enhancement type field effect transistors 2a and 2c are associated with an averaging circuit shown in FIG. 2, and the averaging circuit comprises four capacitors 2i, 2j, 2k and 2m, and three switching elements 2n, 2o and 2p. The capacitor 2i is coupled between the output node OUT2 and a control node Vc', and the control node Vc' is coupled with the gate electrodes of the p-channel enhancement type field effect transistors 2a and 2c. On the other hand, the capacitor 2j is coupled between the control node Vc' and the output node OUT1. The switching element 2n selectively couples the output node OUT2 with the capacitor 2k and with a constant voltage source represented by a small inverted triangle, and the switching element 2p selectively couples the output node OUT1 with the capacitor 2m and with the constant voltage source. The switching element 2o selectively couples the control node Vc' with the capacitors 2k and 2m and with the constant voltage source Vb. The switching elements 2n, 2o and 2p are controlled in such a manner as to regulate the control node Vc' at an average voltage level between the output voltage levels Vout1 and Vout2 at the output nodes OUT1 and OUT2.

The operational amplifier circuit thus arranged behaves as follows. Assuming now that the voltage level at the input node IN1 becomes higher than the input node IN2, the p-channel enhancement type field effect transistor 1b is decreased in channel conductance rather than the p-channel enhancement type field effect transistor 1c, and decreases current passing therethrough. However, the p-channel enhancement type field effect transistor 1c increases current passing therethrough due to the constant current source 1a. The current thus increased lifts the voltage level at the gate electrode of the n-channel enhancement type field effect transistor 2d, and the n-channel enhancement type field effect transistor 2d to pull down the output voltage level Vout2 at the output node OUT2. On the other hand, the current to be decreased allows the voltage level at the gate electrode of the n-channel enhancement type field effect transistor 2b to go down, and the output voltage level Vout1 at the output node OUT1 is elevated. Thus, an output differential voltage takes place between the output nodes OUT1 and OUT2, and the phase compensators 2e and 2f allow the output differential voltage to be in-phase with respect to the input differential voltage.

When the voltage level Vc at the gate electrodes of the p-channel enhancement type field effect transistors 2a and 2c is equal to the constant voltage level Vb, the averaging circuit shown in FIG. 2 regulates the average voltage level to an intermediate voltage level between the first power voltage level on the first power voltage line 3a and the second power voltage level on the second power voltage line 3b. If the first and second power voltage levels are respectively adjusted to 5 volts and zero volt, the averaging circuit regulates the voltage level at the control node Vc' to a certain voltage level {(Vout1 +Vout2) −5 +Vb}, and the certain voltage level is supplied to the gate electrodes of the p-channel enhancement type field effect transistors 2a and 2c. As a result, negative feedback takes place, and controls the constant voltage level Vb and a voltage level {(Vout1 +Vout2) −5} to be equal to each other. Namely, the average voltage level is regulated to 2.5 volts.

However, a problem is encountered in the prior art operational amplifier circuit in small gain of the averaging circuit. This is because of the fact that the gain of the averaging circuit is dominated by the first and second inverting circuits 2a/2b and 2c/2d, and the maximum gain is of the order of 20 dB.

SUMMARY OF THE INVENTION

It is therefore an important object of the present invention provide an operational amplifier circuit which is improved in the gain of an averaging circuit.

To accomplish the object, the present invention proposes to supply an average voltage level to an input amplification stage.

In accordance with the present invention, there is provided an operational amplifier circuit comprising a) an averaging circuit supplied with an output differential voltage between a pair of output nodes, and producing an average voltage level between output voltage levels at the pair of output nodes, b) an input amplification stage having b-1) a first constant current source coupled with a first power voltage line, b-2) a series combination of a first enhancement transistor with a first channel conductivity type and a second enhancement transistor with a second channel conductivity type opposite to the first channel conductivity type coupled between the first constant current source and a second power voltage line different in voltage level from the first power voltage line, b-3) a series combination of a third enhancement transistor with the first channel conductivity type and a fourth enhancement transistor with the second channel conductivity type coupled between the first constant current source and the second power voltage line, the first and third enhancement transistors being respectively gated by a pair of input nodes where an input differential voltage is applied, b-4) a fifth enhancement transistor coupled with the first power voltage line and gated with the average voltage level, b-5) a series combination of a sixth enhancement transistor with the first channel conductivity type and a seventh enhancement transistor with the second channel conductivity type coupled between the fifth enhancement transistor and the second power voltage line, and b-6) a series combination of an eighth enhancement transistor with the first channel conductivity type and a ninth enhancement transistor with the second channel conductivity type coupled between the fifth enhancement transistor and the second power voltage line, the sixth and eighth transistors being respectively gated by the pair of input nodes, a drain node of the seventh enhancement transistor being coupled with gate electrodes of the second and seventh enhancement transistors, a drain node of the ninth enhancement transistor being coupled with gate electrodes of the fourth and ninth enhancement transistors, and c) a driving circuit having c-1) a series combination of a second constant current source and a tenth enhancement transistor with the second channel conductivity type coupled between the first power voltage line and the second power voltage line, one of the pair of output nodes being coupled with a drain node of the tenth enhancement transistor, a gate electrode of the tenth enhancement transistor being coupled with the drain node of the second enhancement transistor, c-2) a series combination of a third constant current source and an eleventh enhancement transistor with the second channel conductivity type coupled between the first power voltage line and the second power voltage line, the other of the pair of output nodes being coupled with a drain node of the eleventh enhancement transistor, a gate electrode of the eleventh enhancement transistor being coupled with the drain node of the fourth enhancement transistor, c-3) a first phase compensator coupled between the aforesaid one of the pair of output nodes and the gate electrode of the tenth enhancement transistor, and c-4) a second phase compensator coupled between the other of the pair of output nodes and the gate electrode of the eleventh enhancement transistor.

BRIEF DESCRIPTION OF THE DRAWINGS

The feature and advantages of the operational amplifier circuit according to the present invention will be more clearly understood from the following description taken in conjunction with the accompanying drawings in which.

DESCRIPTION OF THE PREFERRED EMBODIMENT

Figure 1:
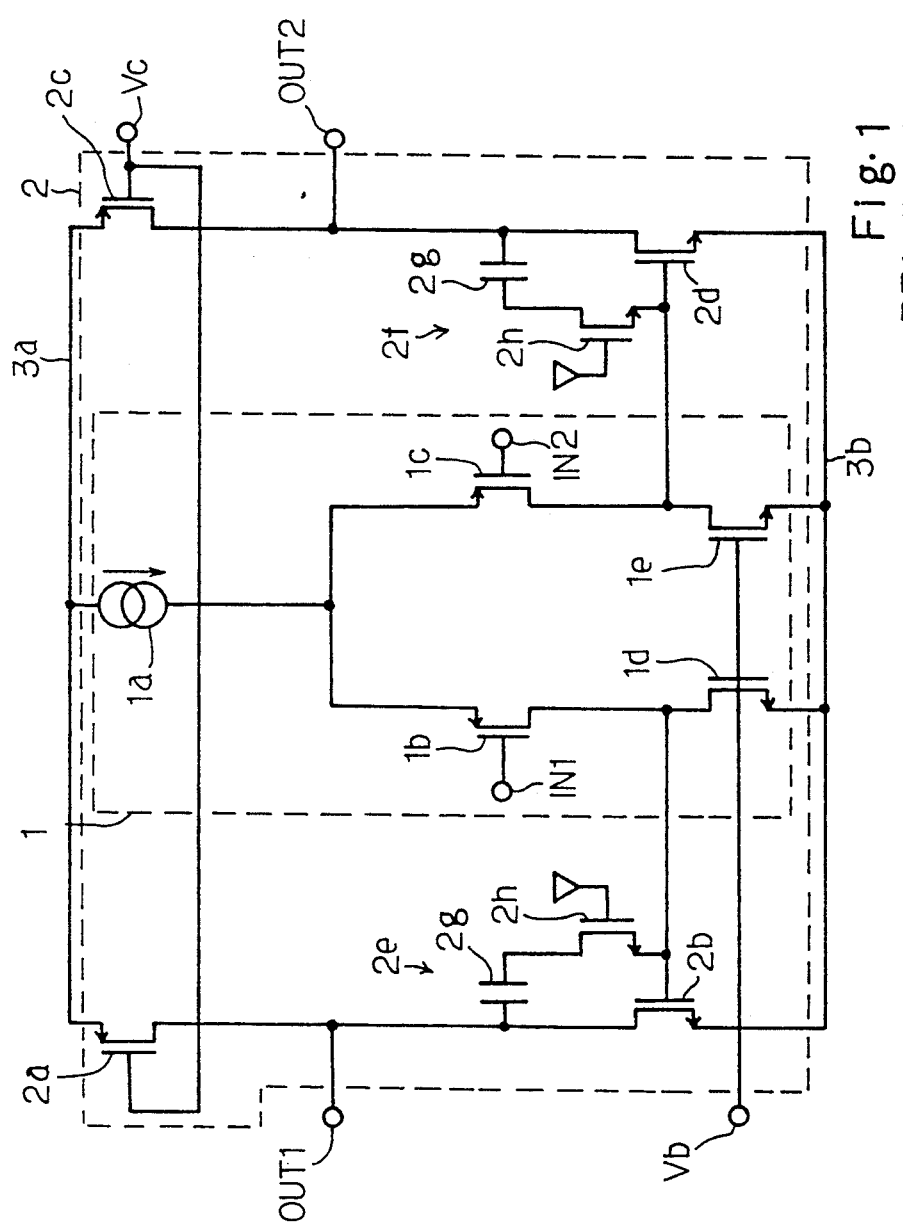
FIG. 1 is a circuit diagram showing the arrangement of the prior art operational amplifier circuit.
Figure 2:
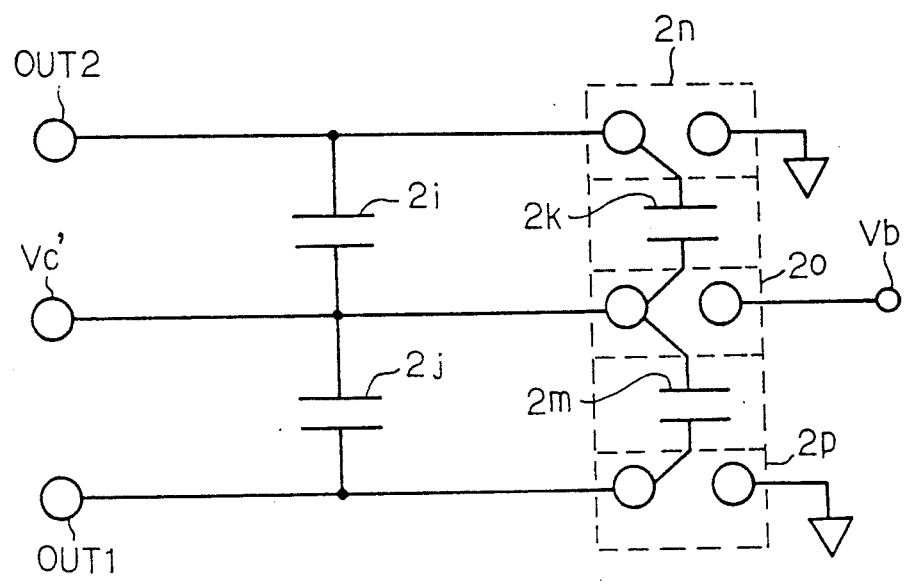
FIG. 2 is a circuit diagram showing the arrangement of the averaging circuit incorporated in the prior art operational amplifier circuit.
Figure 3:
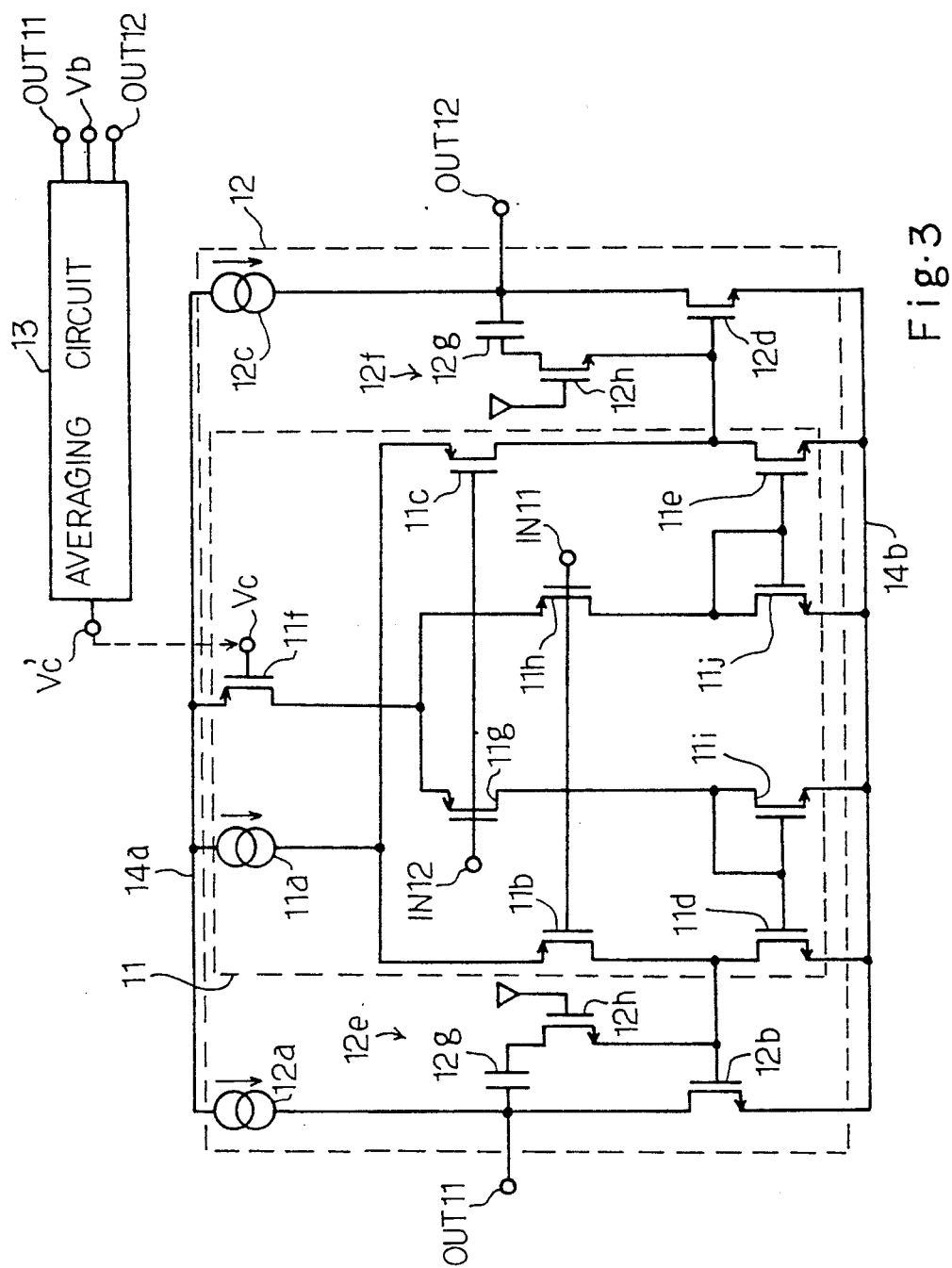
FIG. 3 is a circuit diagram showing the arrangement of an operational amplifier circuit according to the present invention.

Referring to FIG. 3 of the drawings, an operational amplifier circuit embodying the present invention largely comprises an input amplification stage 11, a driving stage 12 and an averaging circuit 13. The averaging circuit 13 is similar in circuit arrangement to the averaging circuit shown in FIG. 2, and any detailed description is not incorporated hereinbelow for the sake of simplicity.

The input amplification stage 11 comprises a constant current source 11a coupled with a first power voltage line 14a, a pair of field effect transistors 11b and 11c coupled in parallel with the constant current source 11a and respectively gated by a pair of input nodes IN11 and IN12, a pair of n-channel enhancement type field effect transistors 11d and 11e coupled in parallel between the p-channel enhancement type field effect transistors 11b and 11c and a second constant voltage line 14b, a p-channel enhancement type field effect transistor 11f coupled with the first power voltage line 14a and gated by the control node Vc' of the average circuit 13, a pair of p-channel enhancement type field effect transistors 11g and 11h coupled in parallel with the p-channel enhancement type field effect transistor 11f and respectively gated by the input nodes IN12 and IN11, and a pair of n-channel enhancement type field effect transistors 11i and 11j coupled between the p-channel enhancement type field effect transistors 11g and 11h and the second constant voltage line 14b. The gate electrodes of the n-channel enhancement type field effect transistors 11d and 11i are coupled with the drain node of the n-channel enhancement type field effect transistors 11i, and the drain node of the n-channel enhancement type field effect transistor 11j is coupled with the gate electrodes of the n-channel enhancement type field effect transistors 11e and 11j. An input differential voltage signal is applied between the pair of input nodes IN1 and IN2.

The driving stage 12 comprises a first series combination of a constant current source 12a and an n-channel enhancement type field effect transistor 12b, and a second series combination of a constant current source 12c and an n-channel enhancement type field effect transistor 12d, and the first and second series combinations are respectively associated with a pair of output nodes OUT11 and OUT12. The n-channel enhancement type load transistors 12b and 12d are accompanied with phase compensators 12e and 12f, and each of the phase compensators 12e and 12f is implemented by a capacitor 12g and an n-channel enhancement type field effect transistor 12h coupled between the associated output node OUT11 or OUT12 and the gate electrode of the n-channel enhancement type field effect transistor 12b and 12d. A constant voltage level indicated by a small inverted triangle is supplied to the gate electrodes of the n-channel enhancement type field effect transistors 12h, and allows the n-channel enhancement type field effect transistors 2h to serve as constant current source. The gate electrodes of the n-channel enhancement type field effect transistors 12b and 12d are respectivley coupled with the drain nodes of the n-channel enhancement type field effect transistors 11d and 11e.

Description is hereinbelow made on circuit behavior of the operational amplifier circuit implementing the embodiment. Assuming now that the voltage level at the input node IN12 becomes higher than that at the input node IN11, each of the p-channel enhancement type field effect transistors 11c and 11g decreases current passing therethrough rather than each current passing through each of the p-channel enhancement type field effect transistors 11b and 11h. The current thus decreased causes the voltage level at the gate electrodes of the n-channel enhancement type field effect transistors 11d and 11i to go down, and the voltage level at the gate electrodes of the n-channel enhancement type field effect transistors 11e and 11j are elevated with the increased current. The channel conductance of the n-channel enhancement type field effect transistor 11d is decreased, and the voltage level at the gate electrode of the n-channel enhancement type field effect transistor 12b goes up. The n-channel enhancement type field effect transistor 12b increases the channel conductance thereof, and the voltage level at the output node OUT11 is decayed. On the other hand, the current passing through the p-channel enhancement type field effect transistor 11h lifts the voltage level at the gate electrodes of the n-channel enhancement type field effect transistors 11e and 11j, and the n-channel enhancement type field effect transistor 11e allows current passing therethrough to be increased. Then, the voltage level at the gate electrode of the n-channel enhancement type field effect transistor 12d goes down, and the n-channel enhancement type field effect transistor 12d lifts the voltage level at the output node OUT12. Thus, the input differential voltage signal is increased in magnitude, and is transferred to the output nodes OUT11 and OUT12.

The average voltage level supplied to the p-channel enhancement type field effect transistor 11f is relayed through the series combinations 11g/ 11i/ 11h/ 11j and the driving stage 12 to the output nodes OUT11 and OUT12, and is amplified twice. Therefore, the gain of the averaging circuit 13 is improved, and the maximum gain is as large as about 80 dB.

If, on the other hand, the voltage level at the input node IN12 becomes lower than that at the input node IN11, each of the p-channel enhancement type field effect transistors 11c and 11g increases current passing therethrough rather than each current passing through each of the p-channel enhancement type field effect transistors 11b and 11h. The current thus increased causes the voltage level at the gate electrodes of the n-channel enhancement type field effect transistors 11d and 11i to go up, and the voltage level at the gate electrodes of the n-channel enhancement type field effect transistors 11e and 11j are decayed with the decreased current. The channel conductance of the n-channel enhancement type field effect transistor 11d is increased, and the voltage level at the gate electrode of the n-channel enhancement type field effect transistor 12b goes down. The n-channel enhancement type field effect transistor 12b decreased the channel conductance thereof, and the voltage level at the output node OUT11 is elevated. On the other hand, the current passing through the p-channel enhancement type field effect transistor 11h causes the voltage level at the gate electrodes of the n-channel enhancement type field effect transistors 11e and 11j to go down, and the n-channel enhancement type field effect transistor 11e allows current passing therethrough to be decreased. Then, the voltage level at the gate electrode of the n-channel enhancement type field effect transistor 12d goes up, and the n-channel enhancement type field effect transistor 12d pulls down the voltage level at the output node OUT12. Thus, the input differential voltage signal also is increased in magnitude, and is transferred to the output nodes OUT11 and OUT12.

The average voltage level supplied to the p-channel enhancement type field effect transistor 11f is also relayed through the series combinations 11g/ 11i/ 11h/ 11j and the driving stage 12 to the output nodes OUT11 and OUT12, and is amplified twice. Therefore, the gain of the averaging circuit 13 is improved.

As will be understood from the foregoing description, the average voltage level is amplified twice, and the gain of the averaging circuit 13 is improved.

Although particular embodiments of the present invention have been shown and described, it will be obvious to those skilled in the art that various changes and modifications may be made without departing from the spirit and scope of the present invention. For example, p-channel enhancement type field effect transistors and n-channel enhancement type field effect transistors may be exchanged.

What is claimed is:

1. An operational amplifier circuit comprising
   a) an averaging circuit supplied with an output differential voltage between a pair of output nodes, and producing an average voltage level between output voltage levels at said pair of output nodes,
   b) an input amplification stage having b-1) a first constant current source coupled with a first power voltage line, b-2) a series combination of a first enhancement transistor with a first channel conductivity type and a second enhancement transistor with a second channel conductivity type coupled between said first channel conductivity type coupled between said first constant current source and a second power voltage line different in voltage level from said first power voltage line, b-3) a series combination of a third enhancement transistor with said first channel conductivity type and a fourth enhancement transistor with said second channel conductivity type coupled between said first constant current source and said second power voltage line, said first and third enhancement transistors being respectively gated by a pair of input nodes where an input differential voltage is applied, b-4) a fifth enhancement transistor coupled with said first power voltage line and gated with said average voltage level, b-5) a series combination of a sixth enhancement transistor with said first channel conductivity type and a seventh enhancement transistor with said second channel conductivity type coupled between said fifth enhancement transistor and said second power voltage line, and b-6) a series combination of an eighth enhancement transistor with said first channel conductivity type and a ninth enhancement transistor with said second channel conductivity type coupled between said fifth enhancement transistor and said second power voltage line, said sixth and eighth transistors being respectively gated by said pair of input nodes, a drain node of said seventh enhancement transistor being coupled with gate electrodes of said second and seventh enhancement transistors, a drain node of said ninth enhancement transistor being coupled with gate electrodes of said fourth and ninth enhancement transistors, and c) a driving circuit having c-1) a series combination of a second constant current source and a tenth enhancement transistor with said second channel conductivity type coupled between said first power voltage line and said second power voltage line, one of said pair of output nodes being coupled with a drain node of said tenth enhancement transistor, a gate electrode of said tenth enhancement transistor being coupled with the drain node of said second enhancement transistor, c-2) a series combination of a third constant current source and an eleventh enhancement transistor with said second channel conductivity type coupled between said first power voltage line and said second power voltage line, the other of said pair of output nodes being coupled with a drain node of said eleventh enhancement transistor, a gate electrode of said eleventh enhancement transistor being coupled with the drain node of said fourth enhancement transistor, c-3) a first phase compensator coupled between said one of said pair of output nodes and the gate electrode of said tenth enhancement transistor, and c-4) a second phase compensator coupled between the other of said pair of output nodes and the gate electrode of said eleventh enhancement transistor.

2. An operational amplifier circuit as set forth in claim 1, in which each of said first and second phase compensators is implemented by a series combination of a capacitor and a twelfth enhancement transistor with said second channel conductivity type, a constant voltage level being supplied to a gate electrode of said twelfth enhancement type transistor.

3. An operational amplifier circuit as set forth in claim 2, in which each of said first, third, sixth and eighth enhancement transistors is implemented by a p-channel enhancement field effect transistor, and each of said second, fourth, seventh, ninth, tenth and eleventh enhancement transistors is implemented by an n-channel enhancement field effect transistor.

* * * * *